United States Patent [19]  
Custode et al.

[11] Patent Number: 4,994,407  
[45] Date of Patent: Feb. 19, 1991

[54] RADIATION HARDENED FIELD OXIDES FOR NMOS AND CMOS-BULK AND PROCESS FOR FORMING

[75] Inventors: Frank Z. Custode, Norco; John G. Poksheva, Whittier, both of Calif.

[73] Assignee: Rockwell International Corporation, El Segundo, Calif.

[21] Appl. No.: 247,053

[22] Filed: Sep. 20, 1988

Related U.S. Application Data

[63] Continuation of Ser. No. 926,319, Oct. 31, 1986, abandoned, which in turn is a continuation-in-part of Ser. No. 736,153, May 5, 1985, abandoned.

[51] Int. Cl.$^5$ .......................................... H01L 21/265  
[52] U.S. Cl. .................................. 437/70; 437/968; 437/67; 437/228  
[58] Field of Search ............... 437/938, 67, 228, 70, 437/68

[56] References Cited

U.S. PATENT DOCUMENTS

| | | |
|---|---|---|
| 3,751,722 | 8/1973 | Richman . |
| 4,403,395 | 9/1983 | Curran . |
| 4,454,647 | 6/1984 | Joy et al. ............................ 437/51 |
| 4,462,847 | 7/1984 | Thompson . |
| 4,519,128 | 5/1985 | Chesebro ............................ 437/67 |
| 4,528,047 | 7/1985 | Beyer ................................. 437/67 |
| 4,534,826 | 8/1985 | Goth .................................. 437/67 |
| 4,679,304 | 7/1987 | Bois . |
| 4,839,115 | 5/1989 | Eklund .............................. 437/67 |

FOREIGN PATENT DOCUMENTS

| | | | |
|---|---|---|---|
| 41851 | 3/1984 | Japan ................................. 437/67 |
| 61-8946 | 1/1986 | Japan ................................. 437/67 |

Primary Examiner—Brian E. Hearn  
Assistant Examiner—Kevin McAndrews  
Attorney, Agent, or Firm—H. Fredrick Hamann; George A. Montanye; Wilfred G. Caldwell

[57] ABSTRACT

The field oxide surrounding an NMOS device or the field oxide around the NMOS device and between the NMOS and PMOS devices in CMOS is split or notched to make at least one thin field oxide region under which a degenerative P+ region is formed in the substrate to increase threshold voltages of the undesired field oxide FET.

7 Claims, 5 Drawing Sheets

RADIATION HARDENED FIELD OXIDES FOR NMOS AND CMOS-BULK AND PROCESS FOR FORMING

FIELD OF THE INVENTION

The apparatus and process relate to radiation hardening in the VLSI field.

BACKGROUND OF THE INVENTION

During recent years, substantial progress has been made in the development of radiation hard N-MOS and CMOS Bulk technologies. The reduction of gate and field oxide thicknesses has increased hardness to ionizing radiation. However, performance and reliability are adversely affected by these techniques.

PRIOR ART

No art is known which discloses either the apparatus or process of this invention.

BRIEF SUMMARY OF THE INVENTION

The field oxide between NMOS devices and/or between NMOS and PMOS devices in CMOS is split or notched to make at least one thin field oxide region under which a heavily doped (degenerate) region is formed to increase threshold voltages.

Effects of radiation on CMOS bulk circuits are more detrimental to N-channel devices. Exposure to radiation tends to shift the thresholds of these devices into depletion. Radiation induced $V_T$ shifts bear a $\sim tox^2$ dependence; hence, field (thick oxide) inversion threshold shifts are significantly larger than those for thinner (gate oxide) oxides. The present invention increases the hardness of field oxides by "splitting" them into regions of thick and thin oxides. The thin portion of the field oxide is grown over a heavily doped (degenerate) substrate so as to increase its threshold voltage. The invention described is compatible with standard processing techniques.

DETAILED DESCRIPTION OF A PREFERRED EMBODIMENT

Figure 13:
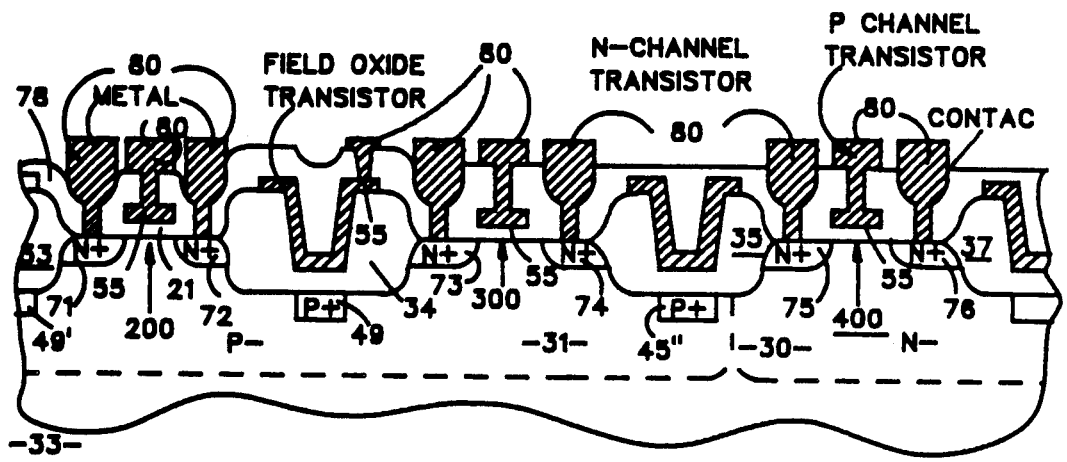
In FIG. 13, an insulator layer has been deposited and contact holes opened with metal deposited, interconnects delineated and etched, followed by a sintering step to complete the device: and, FIG. 14 is a plan view of transistors fabricated in a P-well and in portions of N-wells.

Field oxides employed in and attendant to MOS bulk technology must be such as to inhibit extraneous conduction between functional transistors. The principal measure of efficiency in this regard is contained in the field-oxide threshold voltage, $V_t$. Exposure to radiation generally brings about negative shifts (due to the introduction of positive charge in the oxide) in this threshold voltage. Such negative shifts have particular bearing upon N-channel field transistors, as it can establish deleterious conduction paths, compromising or destroying functional circuit operation. By field transistor here is meant a non functional transistor, i.e., one acting essentially in a parasitic role, whose gate insulating region is comprised of or in some way involves the field oxide region. Such a device is shown in FIG. 13 as source 72, field oxide 34 and source 73 (acting as a drain) with metal interconnects being derived from the network of metal conductors.

It thus may be appreciated that this invention makes use of principles underlying field-oxide threshold voltage, specifically in relation to radiation hardness (tolerance) of field-oxides grown in the context of iso-planar (fully or partially recessed) processing. In such processing, considered the state of the art, the field-oxide is grown thermally from an underlying silicon substrate. The thickness, t, of this thermally grown layer plays an important role in determining its threshold voltage, as seen (with focus on N-channel) from equation (1) below:

$$V_t = \underbrace{-(Eg + 2\phi_F)/2}_{A} + \underbrace{(Q_b - Q_{ss})t/\epsilon}_{B} \underbrace{- (1/\epsilon) \int_0^t \rho(x,t)x\,dx}_{C}$$

where Eg denotes the silicon band gap, $\phi_F$ denotes some effective Fermi level associated with the silicon bulk, t denotes thermal-oxide thickness, $\epsilon$ denotes the thermal-oxide permittivity, $Q_b$ denotes bulk charge in the silicon at the onset of strong inversion, $Q_{ss}$ denotes surface state charge present initially, i.e., before irradiation, and $\rho(x,t)$ denotes radiation induced positive charge introduced into the oxide.

In terms apart from radiation considerations, it is generally desirable to make t as large as possible for two fold reasons: (1) larger t yields larger values for term B in equation (1), leading, in turn, to desirably larger values for $V_t$, and (2) larger t values result in lower parasitic capacitance, Cx, between interconnect configurations and under lying silicon regions ($Cx \propto \epsilon/t$), rendering optimum overall speed performance and lessening cross-talk between devices, both features being highly desirable.

The use of large t in this context conflicts, however, with radiation-related aspects involving the subtractive term C in equation (1). The reason for this is that dependence of term C upon thickness t tends to be of the form $t^n$, $n > 1$, i.e., being super-linear in character. For illustration, if a uniform model is assumed for $\rho(x,t)$, $\rho(x,t) = \rho_0$, the term C would have $t^2$ like dependence. As a result, situations can arise (already supported by experimental evidence) whereby, following exposure to a sufficient radiation dose, negative term C dominates positive term B, with result that the $V_t$ of the thicker oxides will be lower in absolute sense than those with thinner oxides. Potential failure would more closely be identified with the former than with the later in such cases. Hardening strategies to lessen the tendency for term C to dominate B by incorporating thinner oxide in a global fashion incur undesirable penalties vis-a-vis capacitance and speed-performance/cross-talk considerations referred to earlier.

The essence of this invention it is now seen is to incorporate thin oxide regions into the field-oxide in a selective manner via a notched, "split-field", arrangement.

Figure 1:
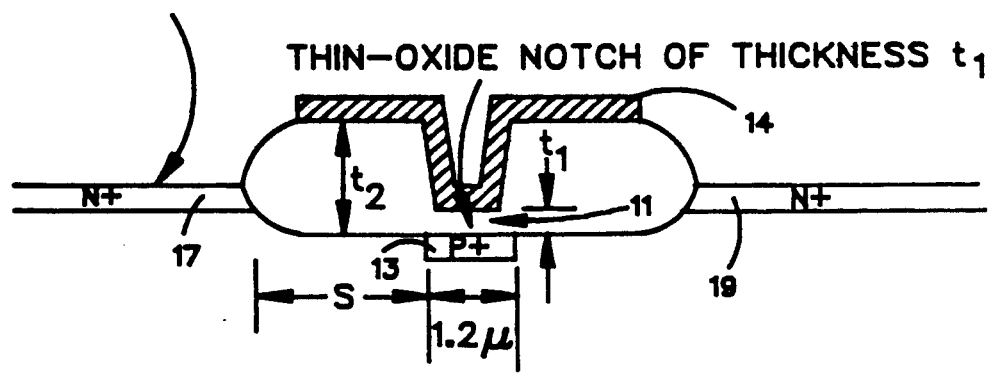
FIG. 1 shows a split field oxide with the thin portion of the field oxide over a heavily doped (degenerate) substrate region and an interconnect conductor spanning the split portion.

The function of the thin-oxide notch is to minimize radiation induced negative shifts associated with term C in equation (1). In addition, the function of the heavily doped region 49 beneath the notch, denoted by P+ in FIG. 1 is to increase the positive value of Qb in term B of equation (1). These two features taken together will combine to ensure sufficient $V_t$ immunity in the notched region to prevent extraneous and deleterious conduction between N+ regions. Projections of the radiation hardening effectiveness of this combination are summarized in Table I.

TABLE I

Hardness characteristics of thin-oxide notched regions with degenerate regions in semiconductor region below it

| | Pre-Rad | Post-Rad | | | |
|---|---|---|---|---|---|
| | | 30 KRADS | | Δ1000 KRADS | |
| $t_1$ | $\Delta V_t$ | | | | |
| A | (V) | $V_t$ | $V_t$ | $V_t$ | $V_t$ |
| 1000 | 54 | 0.6 | 53 | 2 | 52 |
| 2000 | 107 | 2.5 | 104 | 9 | 105 |
| 3000 | 161 | 6.0 | 155 | 20 | 140 |
| 4000 | 215 | 10.0 | 205 | 34 | 180 |
| 5000 | 270 | 16.0 | 254 | 54 | 215 |

In the present invention, the preferred range from the above listing is a thickness of 2000 Å with corresponding hardness.

Hardness characteristics of thick-oxide unnotched regions with non-degenerate regions in semiconductor region below it.

| $t_2$ | | | | | |
|---|---|---|---|---|---|
| 8000 | 29 | −40.0 | <0 | −140 | <0 |
| 10000 | 37 | −63.0 | <0 | −215 | <0 |
| 12000 | 44 | −90.0 | <0 | −310 | <0 |

Additional comments are given regarding the nature of the interconnect configuration illustrated in FIG. 1. As configured here, higher capacitance to the silicon will be obtained in the notched regions, but the area content ($Cx \propto area/t$) of these relatively localized regions will be small; left intact in the major portions of the field-oxide areas, governed by much larger oxide thickness $t_2$, will be the capacitance benefits otherwise accruing with thick oxide.

It should be pointed out that possibilities of filling the notched recess 41 in with other insulators, e.g. overlayed oxides or other insulating materials as nitride, etc., is not precluded.

SOLUTION

To overcome these difficulties, a split field oxide configuration is hereby described:

FIG. 1 shows the elements of the invention. The essence of the field pertains specifically to thin oxide notched regions 11 of thickness $t_1$, in conjunction with a heavily doped (degenerate) p+ region 13 in the semiconductor region immediately beneath the notch. The substrate 15 is P-(doped and the degenerate region is P+doped. An interconnect network conductor is shown at 14.

The N+ regions 17, 19 depicted constitute source and drain regions of a parasitic MOS transistor inherent with field oxide isolation.

Figure 2:
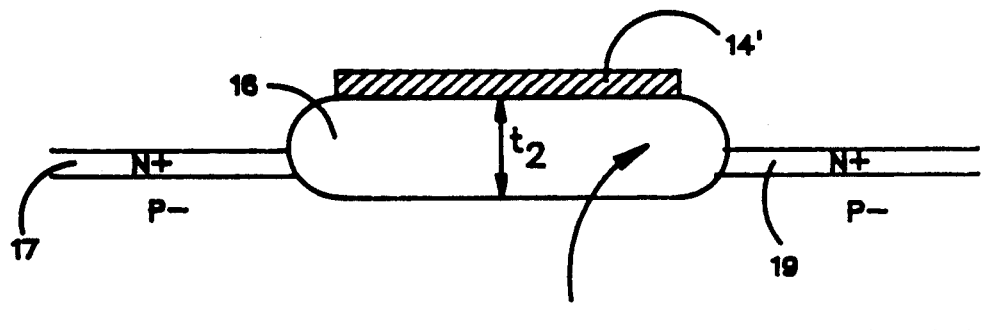
FIG. 2 shows the prior art unsplit field oxide with interconnect conductor thereover.

FIG. 2 depicts present state of the art where a non-split field oxide 16 is utilized. While it is desirable to have as thick a field oxide as possible for isolation and circuit performance purposes, it is also important to have a thinner oxide to withstand radiation effects. Hence, the present invention incorporates a thick field oxide ($t_2$) for isolation/performance purposes, it also incorporates a thin oxide ($t_1$) region for radiation hardness purposes. Again, the thick oxide ($t_2$) yields lower interconnect capacitance promoting circuit speed/performance and minimizing cross-talk effects. The thin oxide portion ($t_1$) inhibits threshold shifts when exposed to radiation environments.

Dimension S in FIG. 1 denotes a separation distance maintained between the degenerate p+ and n+ regions in order to avoid voltage breakdown problems. The minimum width of the degenerate P+ region is a function limited only by quality of lithography/etching processing capabilities. For example a width of 1-2 microns or less may be used. The notched (P+ degenerate) region completely surrounds N-channel-1 device. The impact of this invention in effecting hardness improvements is illustrated in Table I. The results show pre-radiation threshold values for both standard and split field configurations to be more than adequate for providing device isolation under pre-irradiation conditions.

The key innovative features of this invention stems from the fact that the heavily doped p+ layer used in conjunction with the thin oxide region (FIG. 1) promotes significant radiation hardening improvements, doing so in a manner which maintains device isolation, minimizes cross-talk, promotes circuit speed performance, while remaining compatible with existing fabrication techniques. Conductor 14' for the interconnect network is shown on the thick oxide only.

Features of the invention are:
1. Compatible with standard N-channel processing technology
2. Compatible with standard CMOS-bulk processing technology
3. Significant hardness to radiation environments
4. Optimum speed performance capabilities.
5. Minimum cross-talk effects

PROCESS

Process Sequence

General Steps

1. Define active layers
2. Define field implant mask

3. Implant field
4. Grow field oxide
5. Mask notch for split field
6. Etch field oxide
7. Implant degenerate layer p+
8. Grow thin field (split) oxide
9. Proceed with standard process The need to improve the hardness of N-channel devices has been discussed earlier. The steps required to incorporate the innovation in CMOS follow: The actual process sequence may vary; however, the essence of the invention does not depend directly on any particular sequence, but rather the unique steps or combinations thereof. Hence, for illustration purposes the following sequence is used. First, a layer of oxide 21, FIG. 3, and nitride 23 are deposited on the wafer or substrate 20, these layers act as protection against field-oxidation later in the process.

Figure 3:
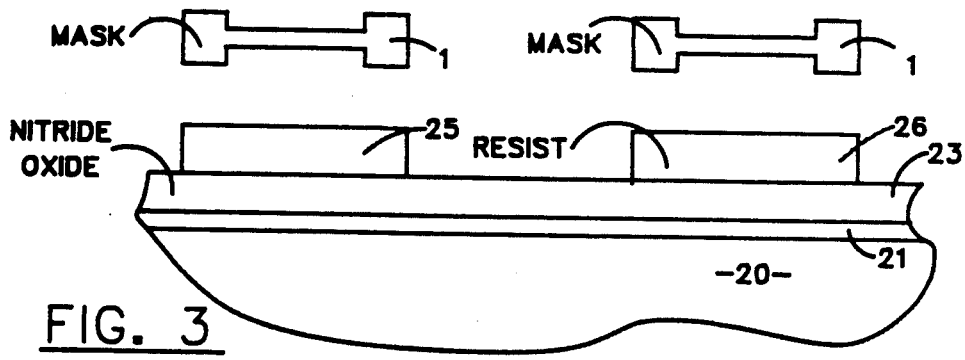
FIG. 3 shows a substrate with a layer of oxide and nitride thereon and resist appropriately formed for delineation.
Figure 4:
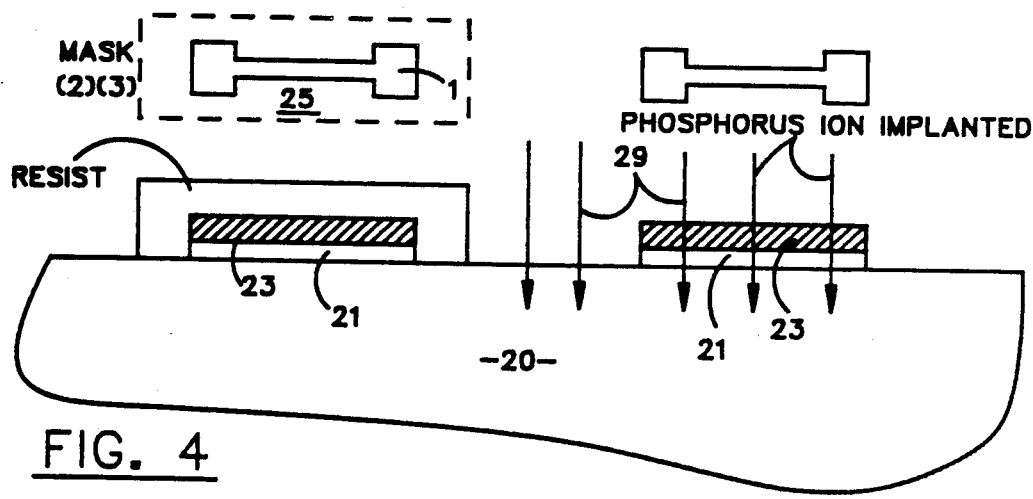
In FIG. 4, the layers have been delineated and the wells are masked and exposed.

The active areas are then delineated, as shown in FIG. 3 using mask 1; next, the wells and the field regions are implanted with the aid of masks 2 and 3 and resist 25, 26 as shown in FIG. 4. This is conventional CMOS processing using masks 1 to protect the active areas and masks 2 and 3 alternately to effect the well implants, phosphorus ions being depicted by arrows 29 for implanting the N-Well 30 (FIG. 5).

Figure 5:
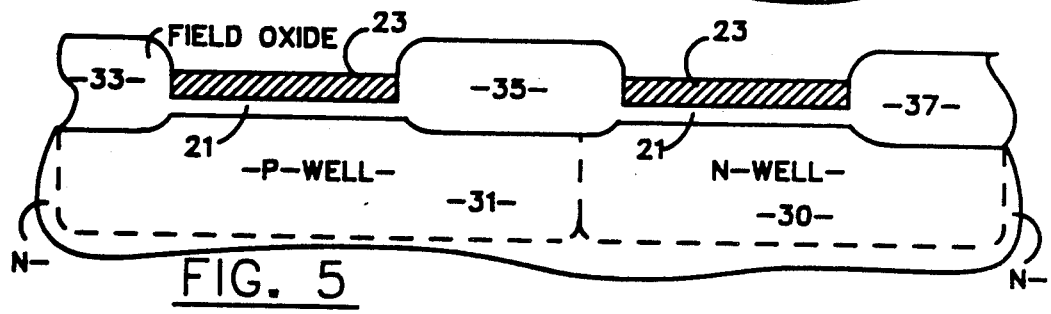
FIG. 5 shows the results of the P well and N well having been driven in with the field oxide grown.

FIG. 5 shows the field oxidation and well drive cycles, P well 31 having been similarly implanted but by boron ions while mask 3 shielded the N-Well side. The field oxide is shown at 33, 35 and 37.

Figure 6:
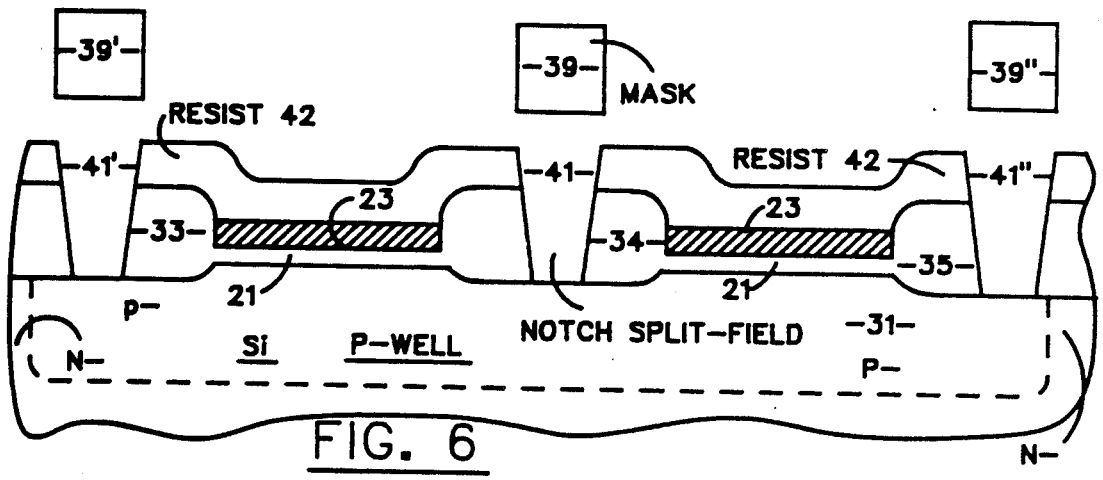
FIG. 6 shows the split field mask having been applied to notch or split the field oxide to bare silicon.
Figure 7:
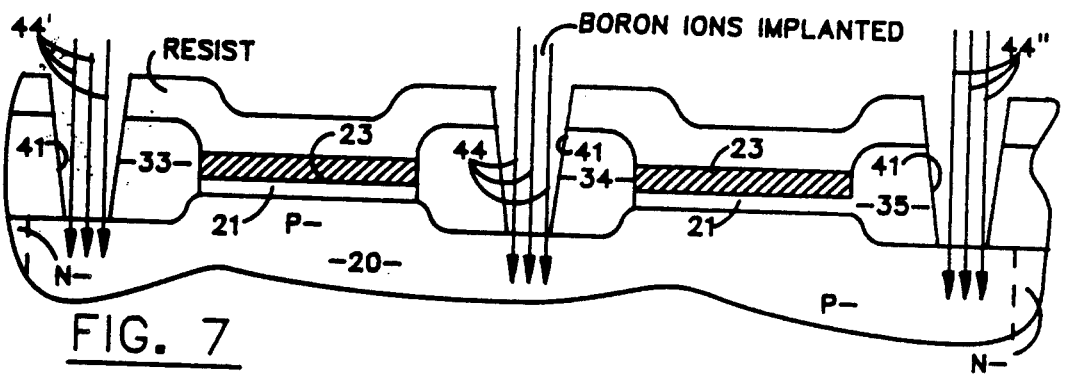
In FIG. 7, a heavy dose of boron ions implants the heavily doped (degenerate) region.

Next, the "split field" mask 39 (FIG. 6) is applied to field oxide 34 and the field oxide 34 etched to bare silicon using resist 42, so as to form a notch 41 in the field region, as shown in FIG. 6. Masks 39' and 39" are similarly employed for field oxide 33 and 35 to produce notches 41' and 41". With the photoresist 42 still in place, a heavy boron dose (arrows 44) is implated into the bare silicon 20, shown in FIG. 7.

Figure 8:
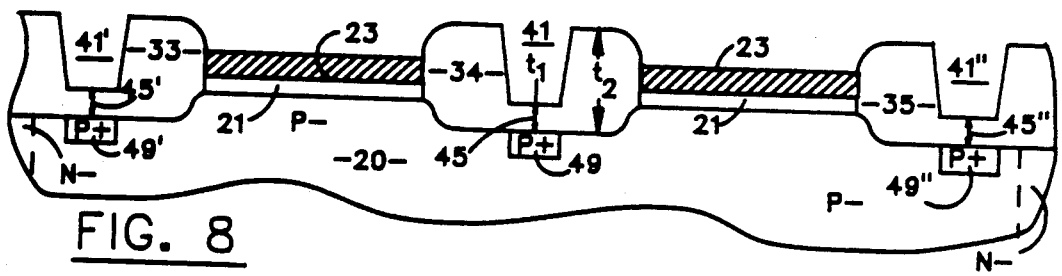
In FIG. 8, the photoresist is stripped from the field oxide and oxide regrown into the notched field region.

Then, the photoresist is stripped and a thin oxide region 45 regrown into the notched field region 41, as depicted in FIG. 8 which also shows degenerate P+region 49 having $10^{18}$ atoms per cubic centimeter or more of P+doping. Similarly, thin oxide regions 45' and 45" are formed at the same time over degenerate regions 49', 49" respectively. The dose implanted and the thickness of the regrown oxide are selected with regard to hardness and performance considerations. For example, the thickness of the thin region may be ½ or less than the thickness of the thick region. By way of example, the thin region or notch may have a thickness of 2000 Å.

Figure 9:
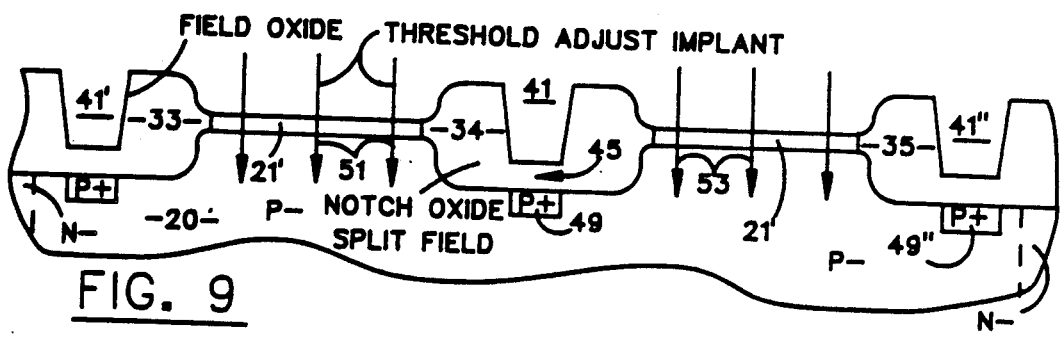
In FIG. 9, the masking nitride is removed from the active areas, and a sacrificial oxide is grown and stripped with also optional threshold adjust implants at this step.
Figure 10:
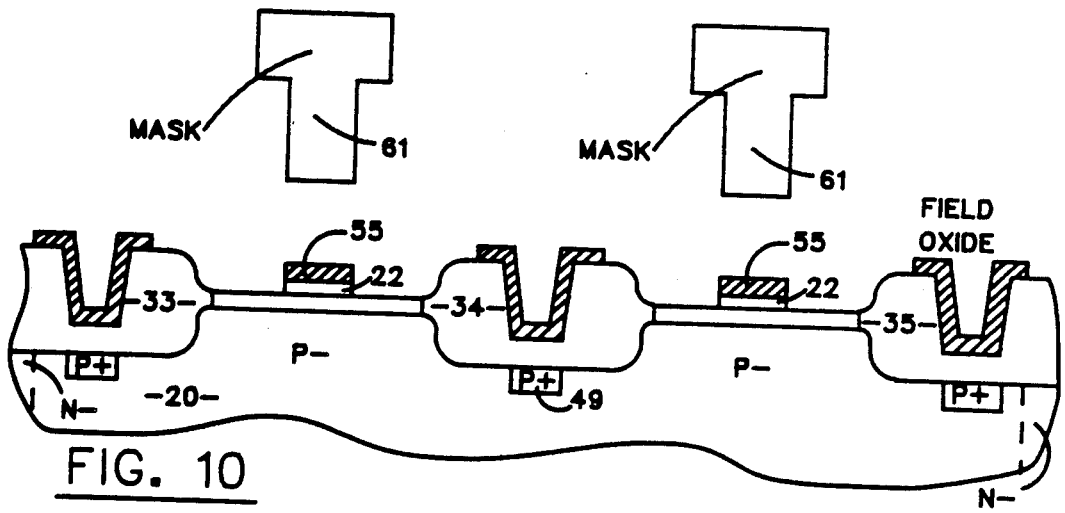
In FIG. 10, polysilicon is deposited and patterned using the gate mask.

Next, the masking nitride 23 and pad oxide 21 are removed from active areas, a sacrificial oxide 21' is grown and stripped, and threshold (optional) adjust implants (arrows 51, 53) performed as shown in FIG. 9. Next, gate oxide 22 is grown, polysilicon 55 is deposited and patterned using the gate masks 61, as depicted in FIG. 10

Figure 11:
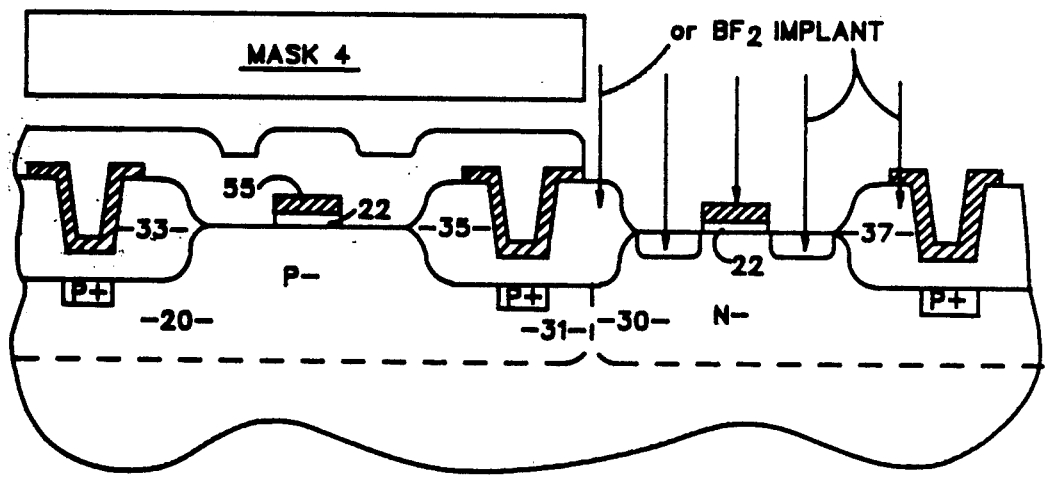
In FIG. 11, sources and drains of P- and N-channel devices are masked and implanted using boron or boron difluoride and arsenic, respectively.
Figure 12:
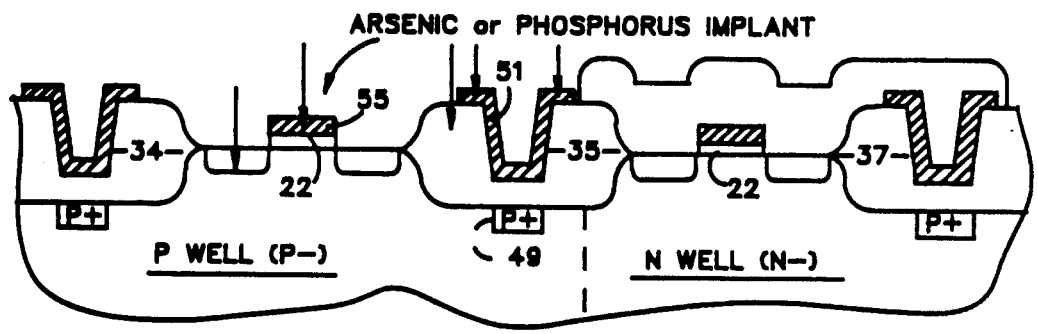
FIG. 12 best shows the resist removal and implant steps of the previous description.

Then, sources and drains of P-channel devices are masked using resist 56 and mask 4 and implanted using boron or boron difluoride. This is shown in FIG. 11. Also, sources and drains of N-channel devices are formed using resist (not shown) but similarl to resist 56 (FIG. 11) and a mask 5 (not shown) but similar to mask 4, and are implanted with phosphorus or arsenic as shown in FIG. 12. FIG. 13 shows P-channel and N-channel sources and drains as 75, 76, 71, 72, 73, 74 respectively.

An insulating layer 78 (FIG. 13) is deposited next (PSG or BPSG or equivalent), and contact holes (eg 79) opened, as shown in FIG. 13.

Next, metal 80 is deposited, interconnects are delineated and etched, followed by a sintering step as depicted in FIG. 13, which now shows two NMOS devices and one PMOS device.

Other steps such as multilevel interconnects, etc., can be incorporated easily into the overall process sequence without affecting the nature of the invention.

Figure 14:
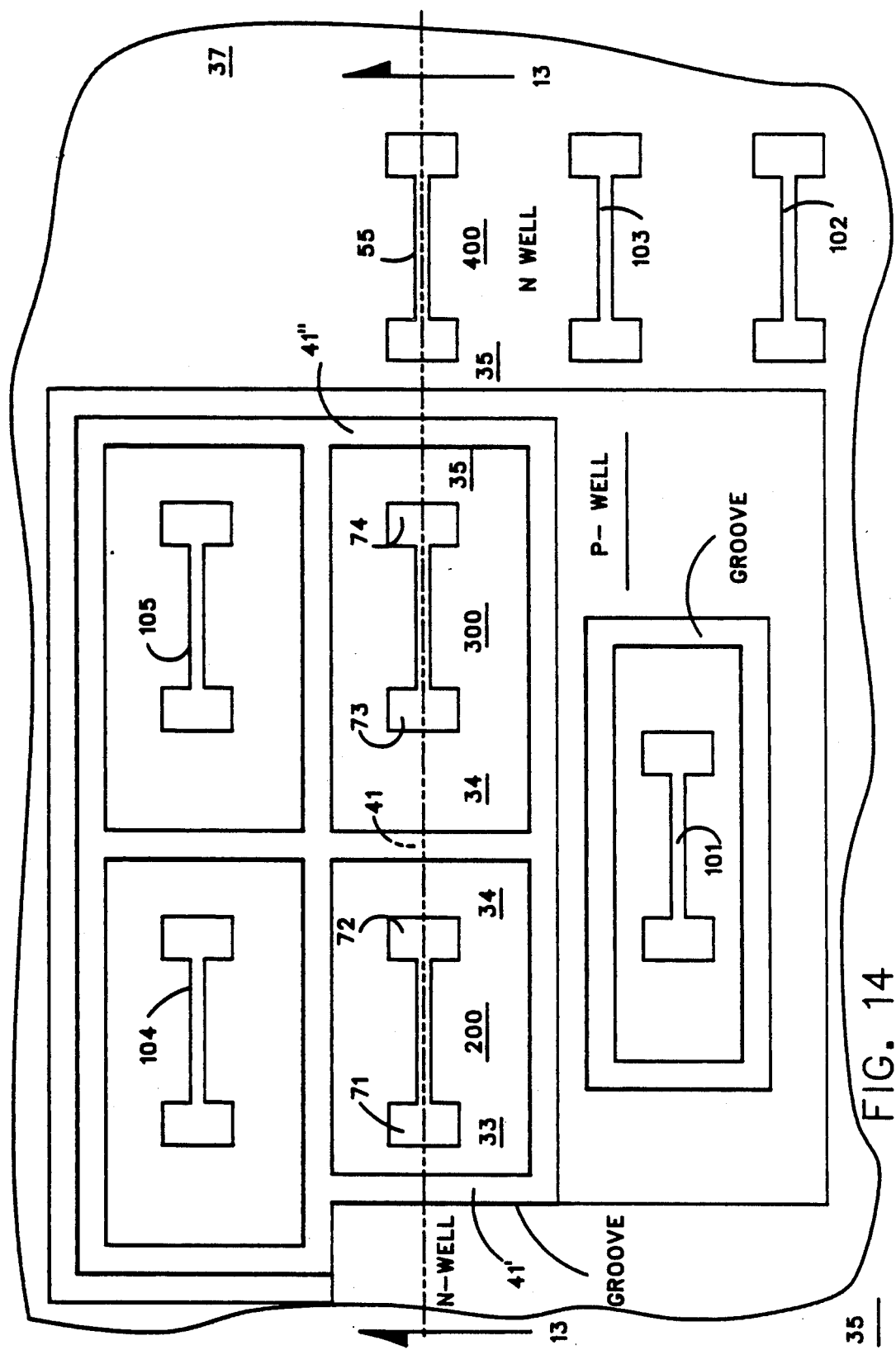

FIG. 14 shows the P-WELL including the devices 200 and 300 and the N-WELL including device 400. The notched or thin portions of the field oxide are visible at 41', 41 and 41" shown surrounding the devices.

What is claimed is:

1. A process for hardening an NMOS device having a P doped silicon substrate or a P well serving as the substrate, comprising the following steps:

masking a region on the substrate where the device will be formed;

oxidizing the unmasked P doped substrate to form field oxide in and above the silicon substrate and surrounding the region;

establishing a peripheral notch in the field oxide about the region which exposes the substrate within the notch;

implanting the so-exposed substrate with boron to create a degenerately doped region in the exposed substrate;

growing a thin oxide to partially fill the notch and cover the exposed substrate to form a thin oxide region within the notch surrounding the region for the device to enhance the field oxide isolation in a radiation harsh environment whereby when radiation breaks down the thick field oxide, said degenerately doped region maintains high voltage threshold in the thin oxide region to maintain radiation hardness; and, unmasking said region and forming said device in said region and further comprising depositing and delineating interconnect conductors over the field oxide on the unnotched portions thereof and on the thin oxide.

2. The process of claim 1 wherein:

said doping for a P doped substrate is P+ having a concentration which is equal to or exceeds $10^{18}$ atoms per cubic centimeter to increase the threshold voltage of the thin oxide in the region of the notch.

3. The process of claim 1 wherein:

the thin portion of the field oxide is of the order of 1 to 2 microns wide due to said notch.

4. The process of claim 1 wherein:

the thickness of the thin field oxide is made to be of the order of ½ or less than the thickness of the unnotched field oxide, said thin field oxide having a thickness of approximately 2000 Å because the thinner the thin oxide, the higher the radiation tolerance.

5. The process of claim 1 further comprising the forming of a PMOS device in association with a NMOS device to form a CMOS device wherein said field oxide which includes a notch about the NMOS device comprises at least the spacing between said devices, and each device is surrounded by a notch in the field oxide.

6. The process of claim 1 wherein said establishing a notch in the field oxides comprises:

notching through the field oxide to the substrate; and, growing field oxide in the notch to a thickness of the order of ½ or less than the field oxide which is unnotched.

7. A process for making hardened NMOS devices each disposed in and above P doped silicon substrates, comprising the following steps:

selectively oxidizing the substrate around the regions where each device is being formed to establish field oxide in and above the silicon substrate which field oxide surrounds each of said regions;

notching through the field oxide to the substrate to form a peripheral notch extending around each device;

heavily doping the substrate through and beneath the notches degenerately to enhance the field oxide isolation;

growing field oxide in the notches to a thickness of the order of ½ or less than the field oxide which in unnotched; and forming said devices in said regions, respectively and further comprising depositing and delineating interconnect conductors over the field oxide on the unnotched portions thereof and on the thin oxide.

* * * * *